(12) United States Patent
Holz et al.

(10) Patent No.: US 9,851,555 B2
(45) Date of Patent: Dec. 26, 2017

(54) OPTICAL COMPONENT

(71) Applicant: Carl Zeiss SMT GmbH, Oberkochen (DE)

(72) Inventors: Markus Holz, Aalen (DE); Benjamin Sigel, Aalen (DE); Jan Horn, Munich (DE); Benedikt Knauf, Aalen (DE); Fabian Haacker, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 5 days.

(21) Appl. No.: 15/050,664

(22) Filed: Feb. 23, 2016

(65) Prior Publication Data

US 2016/0170201 A1    Jun. 16, 2016

Related U.S. Application Data

(63) Continuation of application No. PCT/EP2014/068040, filed on Aug. 26, 2014.

(30) Foreign Application Priority Data

Aug. 28, 2013 (DE) ........................ 10 2013 217 146

(51) Int. Cl.
| | |
|---|---|
| *G03B 27/54* | (2006.01) |
| *G02B 26/08* | (2006.01) |
| *B81B 7/00* | (2006.01) |
| *G03F 7/20* | (2006.01) |

(52) U.S. Cl.
CPC .......... *G02B 26/0833* (2013.01); *B81B 7/007* (2013.01); *G03F 7/2002* (2013.01); *G03F 7/70058* (2013.01); *H01L 2224/05554* (2013.01); *H01L 2224/48091* (2013.01)

(58) Field of Classification Search
CPC .............................. G03F 7/702; G03F 7/70058
USPC .............................. 355/53, 67; 359/291–292
See application file for complete search history.

(56) References Cited

U.S. PATENT DOCUMENTS

| | | | |
|---|---|---|---|
| 2014/0055767 A1* | 2/2014 | Waldis | G02B 7/1815 355/67 |
| 2014/0211187 A1 | 7/2014 | Hauf et al. | |

FOREIGN PATENT DOCUMENTS

| | | |
|---|---|---|
| DE | 10 2011 006 100 A1 | 9/2012 |
| WO | WO 03/042094 A2 | 5/2003 |
| WO | WO 2009/145726 A1 | 12/2009 |
| WO | WO 2010/049076 A2 | 5/2010 |

(Continued)

OTHER PUBLICATIONS

German Office Action, with translation thereof, for corresponding DE Appl No. 10 2013 217 146.3, dated Jul. 15, 2014.

(Continued)

*Primary Examiner* — Hung Henry Nguyen
(74) *Attorney, Agent, or Firm* — Fish & Richardson P.C.

(57) ABSTRACT

An optical component includes at least one micro-opto-electro-mechanical system (MOEMS) with a front side and a rear side. The optical component also includes at least one printed circuit board arranged on the rear side of the at least one MOEMS. The at least one printed circuit board has lateral contacts. The at least one printed circuit board may be equipped with electronic parts and cooling elements. The at least one MOEMS projects laterally beyond the at least one printed circuit board.

20 Claims, 6 Drawing Sheets

(56) References Cited

FOREIGN PATENT DOCUMENTS

WO    WO 2013/120926 A1    8/2013

OTHER PUBLICATIONS

International Search Report for corresponding PCT Appl No. PCT/EP2014/068040, dated Nov. 18, 2014.

\* cited by examiner

OPTICAL COMPONENT

CROSS-REFERENCE TO RELATED APPLICATIONS

The present application is a continuation of, and claims benefit under 35 USC 120 to, international application PCT/EP2014/068040, filed Aug. 26, 2014, which claims benefit under 35 USC 119 of German Application No. 10 2013 217 146.3, filed Aug. 28, 2013. The entire disclosure of international application PCT/EP2014/068040 and German Application No. 10 2013 217 146.3 are incorporated by reference herein

FIELD

The disclosure relates to an optical component. The disclosure furthermore relates to a facet mirror and an illumination optical unit with such an optical component. Furthermore, the disclosure relates to an illumination system for a projection exposure apparatus and a projection exposure apparatus. Finally, the disclosure relates to a method for producing a microstructured or nanostructured component and a component produced in accordance with the method.

BACKGROUND

Optical components with a multi-mirror arrangement embodied as a micro-opto-electro-mechanical system (MOEMS) are known, for example, from DE 10 2011 006 100 A1 and PCT/EP 2013/052 924.

SUMMARY

The disclosure seeks to provide an improved optical component.

In one aspect, the disclosure provides An optical component that includes: at least one micro-opto-electro-mechanical system (MOEMS) with
a front side and a rear side; at least one printed circuit board; and a cavity sealed in a vacuum-tight manner. The at least one printed circuit board is arranged on the rear side of the at least one MOEMS. The core of the disclosure consists of providing an optical component with at least one MOEMS on the rear side of the MOEMS with a printed circuit board. The optical component includes a cavity sealed to the outside in a vacuum-tight manner.

The printed circuit board may have lateral contacts. However, it need not only have lateral contacts.

In accordance with one aspect of the disclosure, the MOEMS projects laterally beyond the printed circuit board. In particular, this is achieved by virtue of the printed circuit board having a smaller cross section than the MOEMS. In particular, the printed circuit board has a smaller cross section than the overall reflection area of the optical component. In particular, it has a cross section which is no larger than, in particular smaller than, the smallest envelope of the individual mirrors of the MOEMS.

The printed circuit board can also have a larger cross section than the at least one MOEMS. In particular, it is possible to arrange a plurality of MOEMSs on the printed circuit board.

In particular, the printed circuit board is arranged on the rear side of the MOEMS by way of the shadow casting principle. This should be understood to mean that the printed circuit board is completely arranged within a volume which extends completely within the region defined by a parallel displacement, in particular an orthogonal displacement, of the footprint of the MOEMS. Such an embodiment of the printed circuit board enables dense packaging, i.e. a substantially gap-free arrangement of a plurality of optical components next to one another with, at the same time, electrical contacting of the components between the printed circuit boards on the rear side of the components. In particular, the optical component is embodied in such a way that a multiplicity of corresponding components are assemblable to form a parqueting, in particular a tessellation, i.e. arrangeable next to one another.

The lateral electrical contacts enable improved fastening and/or simplified assembly of the optical component. In particular, the lateral contact serve for electrical contacting of the printed circuit board and, hence, of the optical component. The electrical contacts can be realized by any elements, the contact force of which on the contact surfaces is generated by a resilient effect. In particular, this can be realized by spring-loaded contact pins and/or contact springs. In this case, the resilient elements can be fastened mechanically both at the optical component and the opposite side. As a result of the lateral contacting, it is possible, in particular, to dispense with rear-side contactings on the rear side of the printed circuit board, which lead to forces counter to the fastening direction of the optical component. Moreover, it is possible to improve the electrical properties of the contacting of the MOEMS.

The lateral contacts can also be used for thermal conduction, in particular for dissipating heat from the optical component. In this case, it is possible, in particular, for one or more, in particular all, contacts to serve both for electrical contacting of the component and for heat dissipation. It is also possible to use a subset of the contacts for electrical contacting and a subset of the contacts for heat dissipation. These subsets can be intersection-free. They can also have common elements.

In particular, the MOEMS is a multi mirror array (MMA) with a multiplicity of individual mirrors. In particular, the individual mirrors are embodied as micromirrors, i.e. with a side length of less than 1 mm. In particular, this can relate to mirrors for EUV optics, i.e. mirrors with a reflection surface for reflecting EUV radiation. With respect to details of the MOEMS, reference is made, in particular, to DE 10 2011 006 100 A1 and PCT/EP 2013/052 924, both of which are intended herewith to be integrated completely as a component of the present application.

In particular, the printed circuit board is securely connected to the MOEMS. By way of example, it can be adhesively bonded, welded, bonded or soldered to the MOEMS. This improves the mechanical stability of the optical component.

In particular, the printed circuit board is impermeably connected to the MOEMS, in particular in a vacuum-tight manner. In particular, it forms part of a housing of the optical component. In this case, the contacts, in particular the lateral contacts, are arranged on the outer side of the housing. They are therefore accessible from the outside. In principle, contacts on the inner side of the housing are also possible.

In accordance with one aspect of the disclosure, the printed circuit board is made from ceramics. In particular, it can be made of low-temperature cofired ceramics (LTCC). Other circuit board materials, e.g. FR4, are also possible.

In accordance with a further aspect of the disclosure, the printed circuit board has a multilayer embodiment. In particular, it has at least 2, in particular at least 4, in particular at least 8, in particular at least 12, in particular at least 16, in particular at least 20 separate layers. A multiplicity of conductor tracks can be arranged on each one of the layers. The number of conductor tracks per layer can be, in particular, at least 2, in particular at least 5, in particular at least 10, in particular at least 20, in particular at least 50, in particular at least 100.

The printed circuit board has a thickness, i.e. an extent in the direction perpendicular to the rear side of the MOEMS, of at least 0.5 mm, in particular 1 mm, in particular at least 1.5 mm, in particular at least 2 mm. The thickness of the printed circuit board can be up to 3 mm, in particular up to 5 mm, in particular up to 10 mm.

In accordance with a further aspect of the disclosure, the at least one printed circuit board forms a lateral boundary of the cavity. In particular, the printed circuit board has a cutout. The cutout is delimited laterally by the printed circuit board, in particular in a circumferential manner. The cavity serves for the arrangement of further components, in particular further electrical components. Therefore, in particular, it is not empty, in particular not completely empty.

In accordance with a further aspect of the disclosure, the cavity is delimited on one side by the rear side of the at least one MOEMS. In other words, the cavity directly adjoins the rear side of the MOEMS. In this manner, electrical contacting between the components arranged in the cavity and the MOEMS is simplified. The components can be electrically connected to the MOEMS by way of wire-bond contacts and/or flip chip contacts. In principle, any type of bonding is possible.

In accordance with a further aspect of the disclosure, the cavity is delimited on one side by a cover. In particular, it is sealed in a vacuum-tight manner via the cover. By way of example, the cover can be made of ceramics or metal. In particular, it can be made of a magnetic or magnetizable material or have corresponding elements. As a result of this, arranging and/or fastening the optical component may be simplified. The cover can also have mechanical fastening elements, in particular for arranging the optical component on a support, for example a base plate.

In accordance with a further aspect of the disclosure, the cavity is delimited by the cover in a vacuum-tight manner. In particular, the cavity is sealed to the outside in a vacuum-tight manner. In particular, it is sealed to the outside in a vacuum-tight manner by the MOEMS, the printed circuit board and the cover. In particular, it is sealed to the outside in a vacuum-tight manner by the MOEMS on one side, by the cover on a side lying opposite to the MOEMS and in a circumferential manner by the printed circuit board in the region between the MOEMS and the cover. As a result of the vacuum-tight embodiment of the cavity, the selection of the electrical components arrangeable therein is improved.

In accordance with a further aspect of the disclosure, parts, in particular electrical parts and/or cooling elements, are arranged in the cavity. In particular, the parts can be a selection of capacitors (capacitances), coils (inductances), sensors, voltage controllers, energy stores (batteries), active cooling elements, in particular Peltier elements, and integrated circuits. The integrated circuits can be ASICs (application-specific integrated circuits), programmable circuits such as e.g. FPGAs (field-programmable gate arrays), programmable processors or a combination of these types.

The parts are arranged particularly securely and robustly in the cavity. Particularly in the case of a vacuum-tight seal of the cavity, the parts need not have a particular vacuum-suitable embodiment. As a result of this, the selection of usable parts increases.

In accordance with a further aspect of the disclosure, the cavity is at least partly potted with a filler material. This improves the stability of the arrangement of the parts and, in particular, of the contacting in the cavity. In particular, it is possible to pot the entire space remaining in the cavity. Furthermore, the filler material can be used to dissipate heat from the introduced components or the MOEMS.

In accordance with a further aspect of the disclosure, the lateral contacts are embodied as vias (vertical interconnect accesses). In particular, they are embodied as open, in particular as half vias, i.e. vias which are freely accessible in the direction across the longitudinal extent thereof. This allows simple production. In particular, the lateral contacts have guiding properties. In particular, they have a self-centering embodiment. An eccentric guidance is also possible. The guiding properties simplify the contacting. For the purposes of contacting the lateral contacts, in particular the half vias, provision is made, in particular, for spring-loaded contacts, in particular spring contacts. These contacts can be soldered to the lateral contacts of the optical component. They can also be connected to the lateral contacts in a purely mechanical manner, in particular as a result of the spring force thereof. The spring contacts are arranged, in particular, on connection printed circuit boards. In particular, provision can be made of arranging such spring contacts on sides of the printed circuit board opposite one another in each case. Particularly in the case of a rectangular, in particular square, embodiment of the printed circuit board of the optical component, spring contacts can advantageously be arranged on each one of the four sides of the printed circuit board. Preferably, at least two spring contacts are arranged in each case on each one of the four sides of the printed circuit board. As a result of this, it is possible to arrange and/or fasten the optical component in a secure and stable manner with the aid of the spring contacts. It is possible to compensate the spring forces across the fastening direction of the MOEMS as a result of the "symmetrical" arrangement of the spring contacts. For the purposes of one-sided contacting, provision can be made for a stop, which absorbs the spring forces, on the side of the printed circuit board lying opposite the spring contact. As a result of one-side contacting, the holding force of the MOEMS is reduced, which then influences the heat flux and, possibly, the position of the MOEMS.

In particular, the lateral contacts have a concave surface. In particular, the surface can have a cylinder barrel-shaped embodiment. In particular, it can have a concave, in particular circular arc section-shaped cross section.

In accordance with a further aspect of the disclosure, the printed circuit board is electrically connected to the at least one MOEMS by way of wire-bond contacts and/or flip chip contacts. In particular, the electrical contacts are arranged on the rear side of the MOEMS. In the case of wire-bond contacts, these are arranged, in particular, in the region of the cavity, in particular in the region of an opening or cutout in the printed circuit board on the rear side of the MOEMS. In the case of flip chip contacts, these are arranged, in particular, in the region between the printed circuit board and the MOEMS. A combination of wire-bond contacts and flip chip contacts, or else the use of further bonding methods, is also possible.

Further objects of the disclosure are to improve a facet mirror for an illumination optical unit of a projection exposure apparatus, an illumination optical unit for a projection exposure apparatus, an illumination system for a projection exposure apparatus, and a projection exposure apparatus. These objects are achieved by the use of an optical component with the features and properties, described above, in the corresponding assemblies and/or systems. The advantages are evident from those described for the optical component.

Further objects of the disclosure are to improve a method for producing a microstructured or nanostructured component and to improve a component produced thus.

These objects are achieved by using a projection exposure apparatus with an optical component according to the disclosure. The advantages correspond to those that were already explained in conjunction with the optical component.

BRIEF DESCRIPTION OF THE DRAWINGS

Further details and advantages of the disclosure will become apparent from the description of a plurality of exemplary embodiments with reference to the drawings. In detail.

DETAILED DESCRIPTION

First of all, the basic design of a projection exposure apparatus 1 is described below on the basis of the figures.

Figure 1:
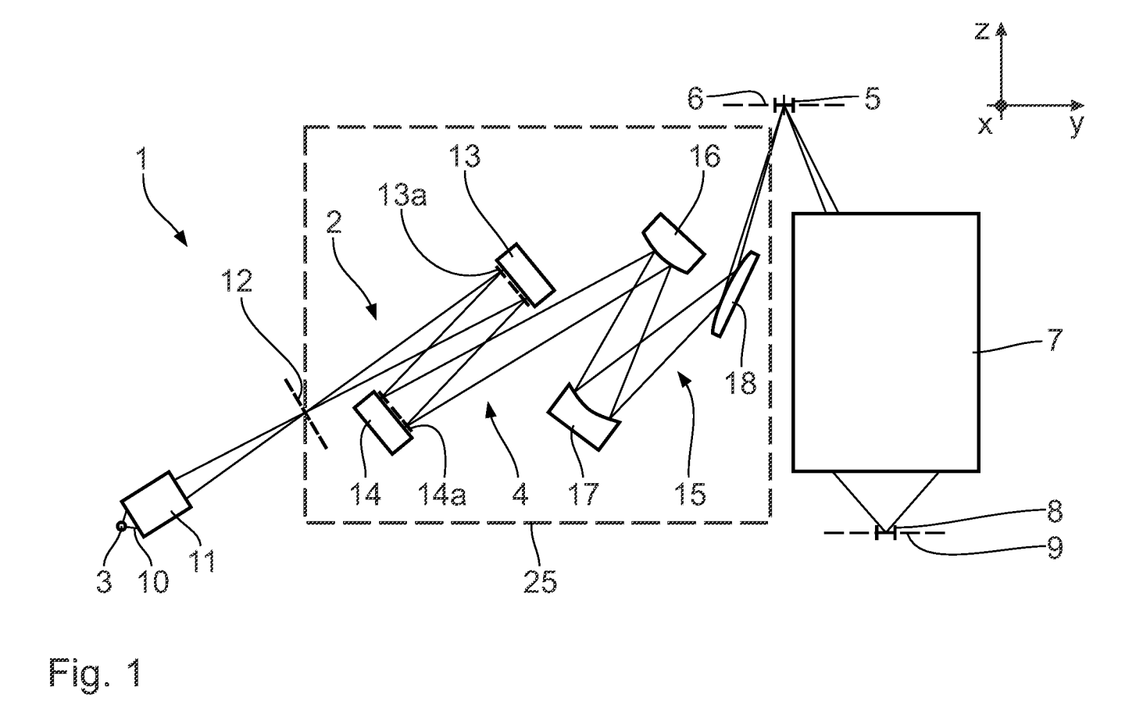
FIG. 1 shows a schematic illustration of a projection exposure apparatus for microlithography, with an illumination system and a projection optical unit in a meridional section.

FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing, the layer being arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 which emanates from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 that is optically conjugate to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14a. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors. In this case, the subdivision of the field facet mirror 13 into individual mirrors can be such that each of the field facets 13a which illuminate the entire object field 5 by themselves is represented by exactly one of the individual mirrors. Alternatively, it is possible to construct at least some or all of the field facets 13a using a plurality of such individual mirrors. The same correspondingly applies to the configuration of the pupil facets 14a of the pupil facet mirror 14, which are respectively assigned to the field facets 13a and which can be formed in each case by a single individual mirror or by a plurality of such individual mirrors.

The EUV radiation 10 impinges on the two facet mirrors 13, 14 at an angle of incidence that is less than or equal to 25°, measured in relation to the normal of the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a grazing incidence mirror. The transfer optical unit 15 together with the pupil facet mirror 14 is also referred to as a sequential optical unit for transferring the EUV radiation 10 from the field facet mirror 13 towards the object field 5. The illumination light 10 is guided from the radiation source 3 towards the object field 5 via a plurality of illumination channels. Each of these illumination channels is assigned a field facet 13a of the field facet mirror 13 and a pupil facet 14a of the pupil facet mirror 14, the pupil facet being disposed downstream of the field facet.

The individual mirrors of the field facet mirror 13 and of the pupil facet mirror 14 can be tiltable by an actuator system, such that a change in the assignment of the pupil facets 14a to the field facets 13a and correspondingly a changed configuration of the illumination channels can be achieved. Different illumination settings result, which differ in the distribution of the illumination angles of the illumination light 10 over the object field 5.

In order to facilitate the explanation of positional relationships, use is made below of, inter alia, a global Cartesian xyz-coordinate system. The x-axis runs perpendicular to the plane of the drawing towards the observer in FIG. 1. The y-axis runs towards the right in FIG. 1. The z-axis runs upwards in FIG. 1.

In selected figures from among the subsequent figures, a local Cartesian xyz-coordinate system is depicted, wherein the x-axis runs parallel to the x-axis according to FIG. 1 and the y-axis together with the x-axis spans the optical area of the respective optical element.

The field facet mirror 13 is embodied in the form of a multi-mirror or micromirror array (MMA). It forms an optical component for guiding the used radiation 10, i.e. the EUV radiation beam. The multi-mirror or micromirror array (MMA) is also referred to merely as a mirror array 22 in the following text. The mirror array 22 is a constituent of a micro-opto-electronic system (MOEMS) 73. It has a multiplicity of individual mirrors arranged in a matrix-like manner in rows and columns in an array. In the following text, the individual mirrors are also referred to as mirror elements 23. The mirror elements 23 are designed to be tiltable by way of an actuator. Overall, the field facet mirror 13 has approximately 100 000 of the mirror elements 23. Depending on the size of the mirror elements 23, the field facet mirror 13 can also have for example 1000, 5000, 7000 or else hundreds of thousands of mirror elements 23, for example 500 000.

A spectral filter can be arranged upstream of the field facet mirror 13 and separates the used radiation 10 from other wavelength components of the emission of the radiation source 3 that are not usable for the projection exposure. The spectral filter is not illustrated.

The field facet mirror 13 is impinged on by used radiation 10 having a power of 840 W and a power density of 6.5 kW/m². The used radiation 10 can also have a different power and/or power density.

The entire individual mirror array of the facet mirror 13 has a diameter of 500 mm and it is designed in a close packed manner with the mirror elements 23. The surface coverage, which is also referred to as degree of filling or integration density, of the complete field facet array by the mirror elements 23 is at least 70%. Insofar as a field facet 13a is represented by exactly one mirror element 23 in each case, the mirror elements 23 represent the shape of the object field 5, apart from a scaling factor. The facet mirror 13 can be formed from 500 mirror elements 23 each representing a field facet 13a and having a dimension of approximately 5 mm in the y-direction and 100 mm in the x-direction. As an alternative to the realization of each field facet 13a by exactly one mirror element 23, each of the field facets 13a can be formed by groups of smaller mirror elements 23. A field facet 13a having dimensions of 5 mm in the y-direction and of 100 mm in the x-direction can be constructed e.g. via a 1×20 array of mirror elements 23 having dimensions of 5 mm×5 mm through to a 10×200 array of mirror elements 23 having dimensions of 0.5 mm×0.5 mm. In accordance with the disclosure, the assignment of the mirror elements 23 to a field facet 13a is flexible. In particular, the field facets 13a are only defined by a suitable actuation of the mirror elements 23. In particular, the form of the mirror elements 23 can be independent of the form of the macroscopic field facets. The mirror elements 23 have reflection surfaces 36 for reflecting the illumination radiation 10. In particular, the reflection surfaces 36 have in each case dimensions in the micrometer range, in particular of less than 1 mm. The mirror elements 23 are therefore also referred to as micromirrors. In principle, the mirror elements 23 can also have a larger embodiment.

The used light 10 is reflected by the mirror elements 23 of the facet mirror 13 towards the pupil facet mirror 14. The pupil facet mirror 14 has approximately 2000 static pupil facets 14a. The latter are arranged alongside one another in a plurality of concentric rings, such that the pupil facet 14a of the innermost ring is fashioned in a sector-shaped manner and the pupil facets 14a of the rings directly adjacent thereto are fashioned in a ring-sector-shaped manner. In a quadrant of the pupil facet mirror 14, 12 pupil facets 14a can be present alongside one another in each of the rings. Each one of the pupil facets 14a can be embodied as a mirror array 22.

The used light 10 is reflected by the pupil facets 14a towards a reflected reticle arranged in the object plane 6. The projection optical unit 7 then follows, as explained above in connection with the projection exposure apparatus according to FIG. 1.

For the purposes of changing the illumination settings, the mirror elements 23 can be pivoted about a tilt angle. In particular, they are pivotable about a tilt angle in the region of at least ±50 mrad, in particular at least ±80 mrad, in particular ±100 mrad. Here, the respective tilt position can be maintained with an accuracy of at least 0.2 mrad, in particular at least 0.1 mrad, in particular at least 0.05 mrad.

The mirror elements 23 carry multilayer coatings for optimizing the reflectivity thereof at the wavelength of the used radiation 10. The temperature of the multilayer coatings should not exceed 425 K during the operation of the projection exposure apparatus 1. This is achieved, inter alia, by a design of the mirror elements 23 with thermal conduction portions (not depicted in the figures), with respect to details of which, reference is made to DE 10 2011 006 100 A1. As is indicated schematically, the mirror elements 23 of the illumination optical unit 4 are housed in an evacuable chamber 25. The operating pressure in the evacuable chamber 25 is a few pascals (partial pressure $H_2$). All other partial pressures are significantly below $10^{-7}$ mbar.

The mirror elements 23 are arranged in a substrate 30. In particular, a silicon wafer can serve as a substrate 30. In particular, the substrate 30 can be formed from a silicon wafer, on which a whole array of mirror elements 23 is arranged.

The mirror elements 23 are displaceable via an actuator device, in particular via an actuator pin 38 and actuator electrodes 54. With respect to details about the actuator device, reference is made again to DE 10 2011 006 100 A1.

Reference is made to WO 2010/049 076 A2 with respect to further details, in particular about the arrangement of the individual mirrors 23 in the substrate 30 and the pivotability thereof via the actuators, as well as the embodiment of the hinge bodies and thermal conduction portions.

Below, further aspects and details of an optical component 40 with the mirror array 22 are described with reference to FIGS. 2 to 6, in particular with reference to FIGS. 2 and 3. In addition to the mirror array 22, the optical component 40 includes a carrying structure 43. Moreover, the optical component includes a printed circuit board 56.

The mirror array 22 with the mirror elements 23 and the substrate 30 has an overall area extending perpendicular to the surface normal 41. It includes a multiplicity of the mirror elements 23, which each have a reflection surface 36 and at least two displacement degrees of freedom. In general, the mirror elements 23 have at least one displacement degree of freedom. They can also have three or more displacement degrees of freedom. In particular, they each have at least one, preferably at least two tilt degrees of freedom. In particular, they can also have another translation degree of freedom. The displacements effectible via the actuators can be pairwise linearly independent. However, they are not necessarily linearly independent. By way of example, it is possible to arrange three or more electrodes 54 equidistantly in a plane around the actuator pin 38.

The mirror elements 23 have a square cross section. In principle, they can also have a triangular, rectangular or hexagonal embodiment. They are embodied as parqueting elements. The totality of the mirror elements forms a parqueting of an overall reflection area of the mirror array 22. The parqueting is a tessellation, in particular. The mirror elements 23 are arranged in a particularly tightly packed manner. In particular, the mirror array has a degree of filling of at least 0.85, in particular at least 0.9, in particular at least 0.95. Here, the degree of filling, which is sometimes also referred to as integration density, denotes the ratio of the overall reflection area, i.e. the sum of the reflection surfaces 36 of all mirror elements 23 of the mirror array 22, to the overall area of the array 22. The reflection surface 36 of the mirror elements 23 has a planar embodiment. In principle, it can also have a concave or convex embodiment or an embodiment as a free-form surface.

The reflection surface 36 of the mirror elements 23 is provided, in particular, with a (multilayer) coating for optimizing the reflectivity thereof at the wavelength of the used radiation 10. In particular, the multilayer coating enables the reflection of used radiation 10 with a wavelength in the EUV range, in particular in the range from 5 nm to 30 nm.

The mirror array 22 has a modular embodiment. In particular, it is embodied in such a way as a tiling element that the parqueting of the overall reflection area of the mirror array 22 is expandable as desired by tiling a plurality of such tiling elements, i.e. a plurality of mirror arrays 22 with an identical embodiment. Here, the different terms "parqueting" and "tiling" are only used to distinguish between the parqueting of the overall reflection area of an individual mirror array 22 by the mirror elements 23 and that of a multi-mirror array by the plurality of mirror arrays 22. They both denote a gap-free and overlap-free coverage of a simple contiguous region in a plane. Even if the coverage of the overall reflection area is not perfectly without gaps in the present case, which is reflected by the degree of filling <1, reference is still made below to a parqueting or tiling if the degree of filling has the value specified above, in particular at least 0.85.

The mirror elements 23 are held by the substrate 30. The substrate 30 has an edge region 42 extending in the direction perpendicular to the surface normal 41. In particular, the edge region 42 is arranged in a manner encircling the mirror elements 23. In the direction perpendicular to the surface normal 41, it has a width b, in particular a maximum width b, of at most 5 mm, in particular at most 3 mm, in particular at most 1 mm, in particular at most 0.5 mm, in particular at most 0.3 mm, in particular at most 0.2 mm. Therefore, the overall area of the mirror array 22 projects by at most 5 mm, in particular at most 3 mm, in particular at most 1 mm, in particular at most 0.5 mm, in particular at most 0.3 mm, in particular at most 0.2 mm over the overall reflection area, i.e. over the outer edges thereof, in the direction perpendicular to the surface normal 41.

The overall area of the mirror array 22 lies in the range from 1 mm×1 mm to 50 mm×50 mm, in particular in the range from 10 mm×10 mm to 25 mm×25 mm. In principle, other dimensions are also possible. In particular, it can also deviate from the square form. The protrusion of the overall area of the mirror array 22 over the overall reflection area thereof is also referred to as a side or lateral overhead. The ratio of the lateral overhead to the overall extent in the same direction is at most 0.1, in particular at most 0.05, in particular at most 0.03, in particular at most 0.02, in particular at most 0.01. The lateral protrusion is therefore smaller than the overall extent of the overall reflection area of the mirror array 22 by at least one order of magnitude.

The carrying structure 43 is arranged offset from, in particular adjacent to, the mirror array 22 in the direction of the space surface normal 41. It preferably has a cross section which is identical to that of the substrate 30 of the mirror array 22. In general, it projects by at most 5 mm, in particular at most 3 mm, in particular at most 1 mm, in particular at most 0.5 mm, in particular at most 0.1 mm, in particular at most 0.05 mm, in particular not to all, over the substrate 30 and hence the overall area of the mirror array 22 in the direction perpendicular to the surface normal 41. Such an arrangement is also referred to as an arrangement according to the "shadow casting principle". This is understood to mean, in particular, that the carrying structure 43 is arranged completely within a parallel projection of the overall area of the mirror array 22 in the direction of the surface normal 41.

The carrying structure 43 is made of a ceramics-containing and/or silicon-containing and/or aluminum-containing material. This enables the dissipation of heat from the mirror array 22 with, at the same time, high mechanical stability. Examples for the material of the carrying structure 43 are ceramic materials, silicon, silicon dioxide, aluminum nitrite and aluminum oxide, for example $Al_2O_3$ ceramic material. In particular, the carrying structure 43 can be produced from a wafer. The carrying structure 43 can also be produced from quartz or a glass wafer, which is provided with so-called thermal vias. In the direction of the surface normal 41, the carrying structure 43 has a thickness of less than 1 mm, in particular less than 500 μm.

In particular, the carrying structure 43 is embodied as a micro-electro-mechanical system (MEMS). The carrying structure 43 has a cutout 44 open on one side. The cutout 44 forms a receiving space, open on one side, for receiving further functional constituents. On the side thereof opposite to the mirror array 22, the cutout 44 is delimited by a base 45 of the carrying structure in the direction of the surface normal 41. Laterally, i.e. in the direction perpendicular to the surface normal 41, it is delimited by an edge region 46 of the carrying structure 43. In a direction perpendicular to the surface normal 41, the edge region 46 has a width $b_C$. Here, $0.5 \times b \leq b_C \leq 2 \times b$ applies. In particular, the edge region 46 of the carrying structure 43 can be just as wide as the edge region 42 of the substrate 30, $b=b_C$.

The carrying structure 43 is mechanically connected to the mirror array 22 only in this edge region 46. A sealing element 61 is arranged between the carrying structure 43 and the mirror array 22. The sealing element 61 is integrated into a metallization on a rear side 48 of the substrate 30 of the mirror array 22. It can also be embodied as a sealing ring arranged on the edge region 46 of the carrying structure 43. The receiving space formed by the cutout 44 is therefore encapsulated, i.e. sealed in a liquid-tight, in particular gas-tight manner, at least during the production of the component 40. In principle, it is possible to arrange components, in particular electrical components, in particular ASICs 52 in an encapsulated manner, i.e. sealed in a liquid-tight, in particular gas-tight manner, in the receiving space. To this end, a continuous intermediate layer (not depicted in the figures) between the mirror array 22 and the ASICs 52 is present.

A multiplicity of signal lines 47 are integrated into the carrying structure 43. The signal lines 47 are embodied as vertical interconnect accesses, so-called "vias". They are bonded directly at the rear side 48 of the mirror array 22 opposite to the reflection surfaces 36. They are moreover provided with contact elements 50 on the side opposite to the mirror array 22, i.e. on the rear side 49 of the carrying structure 43. Each component 40 can have more than 30, in particular more than 50, in particular more than 70 signal lines 47. The signal lines 47 serve, inter alia, to supply voltage to a driver stage of a displacement device for displacing the mirror elements 23. The driver stage is integrated into the carrying structure 43. In particular, it is embodied as an application-specific integrated circuit 52 (ASIC). The component 40 can have a plurality of ASICs 52. It includes at least one ASIC 52, in particular at least two, in particular at least four, in particular at least nine, in particular at least 16, in particular at least 25, in particular at least 100 ASICs 52. Here, each one of the ASICs 52 is signal connected to at least one mirror element 23, in particular to a multiplicity of mirror elements 23, in particular to at least two, in particular at least four, in particular at least eight mirror elements 23. With respect to details about controlling the actuators for displacing the mirror elements 23, reference is made to WO 2010/049 076 A2.

The signal lines 47 to the ASICs 52 run from the rear side 49 of the carrying structure 43 through the carrying structure 43 to the rear side 48 of the mirror array 22, from there they run along the rear side 48 of the mirror array 22 and run to the ASICs 52 by way of a flip chip contact 53. A description of flip chip technology is found in the book "Baugruppentechnologie der Elektronik-Montage" (Editor: Wolfgang Scheel, 2nd edition, Verlag Technik, Berlin, 1999). The signal lines to the integrated or local driver electronics are therefore guided on the rear side 48 of the mirror array 22. A control voltage generated on the ASIC 52 for controlling the displacement of one of the mirror elements 23 is brought by way of a further flip chip contact 53 onto the rear side 48 of the mirror array 22 to a corresponding electrode 54. Therefore, all electrical contacting of one of the ASICs 52 is on the same side of the ASIC 52. In particular, they are situated on the side of the ASIC 52 facing the mirror array 22. Two-sided contacting and through-contacting of the ASIC 52, which, in principle, are likewise possible, are avoided hereby. A further advantage of such an arrangement of the signal lines 47 consists of the fact that all signal lines 47 can be laid on the rear side 48 of the mirror array 22 in a single metal layer. This leads to a simplification of the production process and hence to a reduction in the production costs.

Moreover, the signal lines 47 are embodied and arranged in such a way that specific signal lines 47 are combined on the front side 43a of the carrying structure 43, facing the mirror array 22, and/or on the rear side 49 of the same. By way of example, the signal lines 47 for the feed voltages of the ASICs 52 are combined. This leads to a signal reduction in the region of the carrying structure 43. In particular, the signal reduction in the region of the carrying structure 43 is at least 10:1.

On the rear side 49 of the carrying structure 43, the latter has an electrical interface 55. In particular, this interface 55 is completely arranged on the rear side 49 of the carrying structure 43 lying opposite the mirror array 22. Therefore, the "shadow casting principle" is also observed in the signal flow. The component 40 has a vertical integration.

The electrical interface 55 has a multiplicity of contact elements 50 applied on the rear side 49 of the carrying structure 43. In particular, the contact elements 50 can have a two-dimensional embodiment.

As an alternative thereto, the contact elements 50 of the electrical interface 55 can also be embodied as integrated pins in the carrying structure 43. In this case, vertical interconnect accesses (vias) in the carrying structure 43, which are embodied e.g. as through-bores filled with gold, are partly exposed in the region of the rear side 49 of the carrying structure 43. In particular, this can be achieved by etching away part of the material of the carrying structure 43 surrounding the vias. The exposed piece of the vias now forms the contact element 50.

In particular, the metal foil 57 can be arranged between the ASICs 52 and the base 45 of the carrying structure 43. In so doing, it can also form a thermal interface between the ASICs 52 and the carrying structure 43. In this case, it is advantageous for the metal foil 57 to be embodied as a soft, corrugated metal foil, that is to say as a so-called spring foil.

Moreover, an additional heat-conducting element 58 can be arranged between the ASICs 52 and the base 45 of the support structure 43, in particular between the ASICs 52 and the metal foil 57. A plurality of heat-conducting elements 58 can also be provided. The ASICs 52 can, in particular, be embedded at least partly into the heat-conducting element 58 within the cutout 44. Such a thermal interface between the ASICs 52 and the base 45 of the carrying structure 43 improves the vertical integration of the heat flow through the component 40. Heat from the mirror array 22 and in particular from the ASICs 52 can in this case be dissipated directly, that is to say substantially in the direction of the surface normal 41, to the base 45 of the carrying structure 43 and through the latter.

Below, there is a description of further details of the optical component 40, in particular of the printed circuit board 56 and arrangement and the connection thereof with the MOEMS, in particular with the carrying structure 43 and/or the mirror array 22.

The printed circuit board 56 is arranged in the rear side 49 of the MOEMS 73 including the mirror array 22 and the carrying structure 43. In particular, the printed circuit board 56 is adhesively bonded to the MOEMS 73 via an adhesive layer 62. The adhesive layer 62 can have a thermally conductive embodiment.

Instead of the adhesive layer 62, provision can also be made for an alternative mechanism for connecting the printed circuit board 56 to the MOEMS 73. In particular, the printed circuit board 56 has a force-fit connection with the MOEMS 73.

In particular, the printed circuit board 56 is securely connected to the MOEMS 73. Preferably, the printed circuit board 56 is impermeably connected to the MOEMS 73, in particular in a vacuum-tight manner.

By way of wire-bond contacts 63, the printed circuit board 56 is connected to the MOEMS 73, in particular to the contact elements 50, in an electrically conductive manner.

The printed circuit board 56 is made out of ceramic material. In particular, it is made of low-temperature cofired ceramics (LTCC). Other materials are likewise possible.

The printed circuit board 56 has a multilayer embodiment. It includes at least 2, in particular at least 4, in particular at least 8, in particular at least 12, in particular at least 16 layers. Each one of the layers can include a multiplicity of conduct tracks. The number of conductor tracks per layer is, in particular, at least 2, in particular at least 5, in particular at least 10, in particular at least 20, in particular at least 50, in particular at least 100. The number of conductor tracks can also be significantly higher. In principle, it is only limited by the geometric dimensions of the printed circuit board 56.

In the direction of the surface normal 41, the printed circuit board 56 has a thickness $d_L$ of at least 0.5 mm. In particular, the thickness $d_L$ of the printed circuit board 56 can be at least 1 mm, in particular at least 1.5 mm, in particular at least 2 mm. The thickness $d_L$ of the printed circuit board 56 can be up to 3 mm, in particular up to 5 mm, in particular up to 10 mm.

The printed circuit board 56 forms a lateral boundary of the cavity 64. The cavity 64 serves to receive further components, in particular electronic components. The remaining space in the cavity 64 can be filled with a filler material 65. In particular, the remaining space in the cavity 64 can be partly or completely filled, in particular potted, with the filler material 65.

Filling the cavity 64 with the filler material 65 can lead to improved thermal contact of the MOEMS 73, in particular of the carrying structure 43 and/or the mirror array 22 with the cover 66. Moreover, it can lead to mechanical stabilization of the bond wires. Moreover, it can lead to an improved electrical insulation of the bond wires.

The cavity 64 is open at the end side. It is directly adjacent to the rear side 49 of the MOEMS 73, in particular of the carrying structure 43. Therefore, the cavity 64 is delimited on one side by the MOEMS 73.

On the side lying opposite the MOEMS 73, the cavity 64 is delimited by a cover 66. In particular, the cavity is closed off by the cover 66, in particular sealed, in particular sealed in a vacuum-tight manner. By way of example, a metal plate serves as cover 66. Other materials are likewise conceivable.

In particular, the cover 66 can be made of a ferromagnetic material and/or have ferromagnetic elements. This simplifies the arrangement of the optical component 40 on a base plate 59. Moreover, mechanical holding elements (not depicted in the figures) can be arranged on the cover 66.

The printed circuit board 56 has lateral contacts 67. The lateral contacts 67 are embodied as cut-open, in particular half vias. In particular, the lateral contacts 67 have a self-centering embodiment. In particular, they have a concave, in particular circular arc section-shaped cross section.

The lateral contacts 67 can respectively be arranged in pairs on mutually opposing sides of the printed circuit board 56.

The MOEMS 73 protrudes laterally, i.e. in a direction perpendicular to the surface normal 41, over the printed circuit board 56. The protrusion lies in the region of 1 mm to 5 cm, in particular in the region from 3 mm to 3 cm.

Contact springs 68 are provided for contacting the lateral contacts 67 of the optical component 40, in particular the printed circuit board 56. The contact springs 68 in turn are connected to a connection printed circuit board 69 in an electrically conductive manner. The contact springs 68 can contribute to the mechanical stabilization of the optical component 40. They can also be securely connected to the lateral contacts 67, in particular adhesively bonded, soldered or welded to the latter. The connection printed circuit boards 69 can respectively be arranged in pairs on mutually opposing sides of the optical component 40. In particular, the optical component can be held in a clamping manner between contact springs 68 arranged in a pairwise manner. In particular, it is also possible to arrange connection printed circuit boards 69 with contact springs 68 on all four sides of the printed circuit board 56. As a result of this, particularly secure fixing of the component 40 is made possible. The contact springs 68 serve primarily for electrical contacting of the printed circuit board 56. The mechanical fastening of the optical component 40 is brought about by way of the cover 66 in particular. In principle, it is also possible for the contact springs 68 to contribute to the mechanical fastening of the optical component 40.

The connection printed circuit boards 69 with the contact springs 68 can form constituents of the base plate 59. In particular, they are mechanically connected to the base plate 59.

Figure 2:
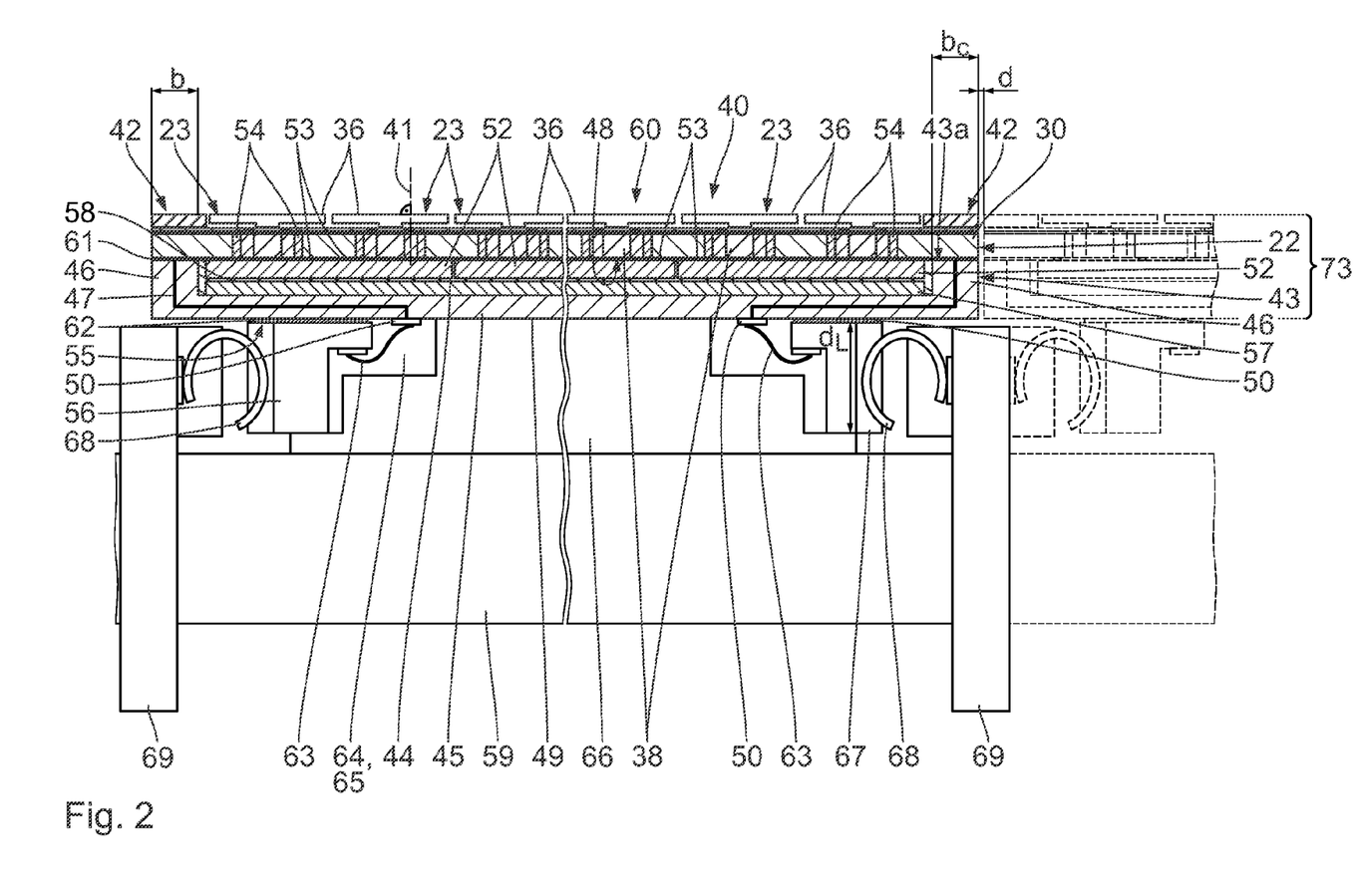
FIG. 2 shows a schematic cross section through an embodiment of an optical component with a micro-opto-electro-mechanical system (MOEMS) and a printed circuit board.
Figure 3:
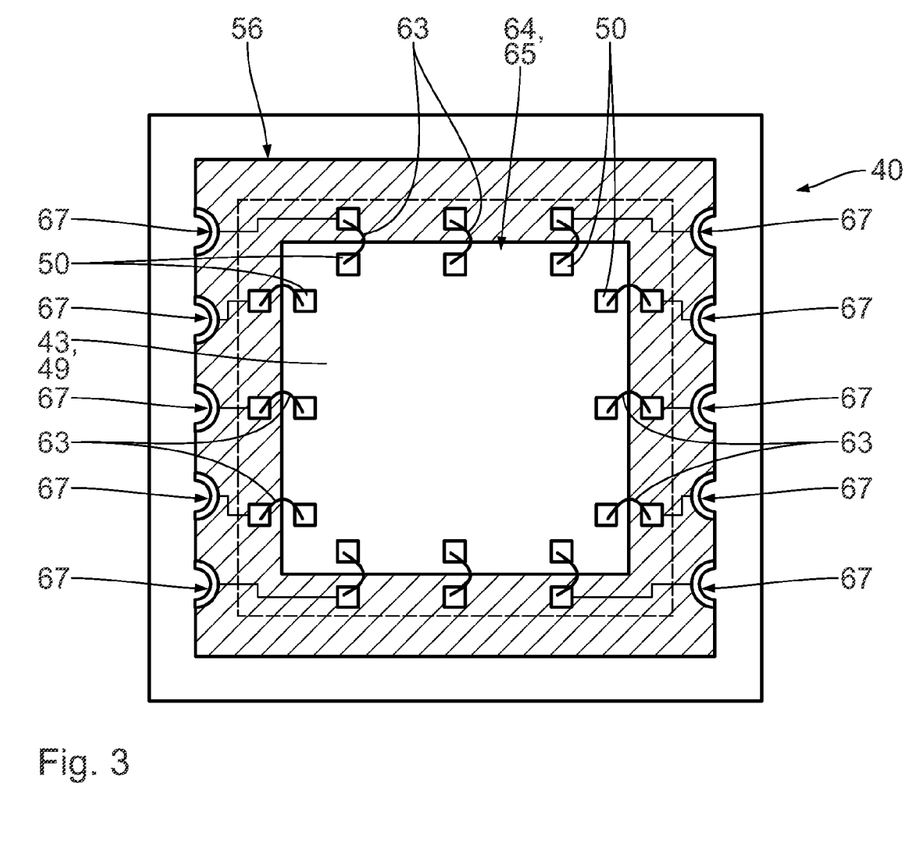
FIG. 3 shows a view of the optical component in accordance with FIG. 2 with the cover taken off the rear side.

As indicated schematically in FIG. 2, the connection printed circuit boards 69 with the contact springs 68 can also be arranged between two optical components 40. In this case, they can be embodied in a substantially mirror-symmetrical manner in relation to a center plane extending parallel to the surface normal 41. In particular, they can have contact springs 68 arranged on opposite sides in a pairwise manner.

Figure 4:
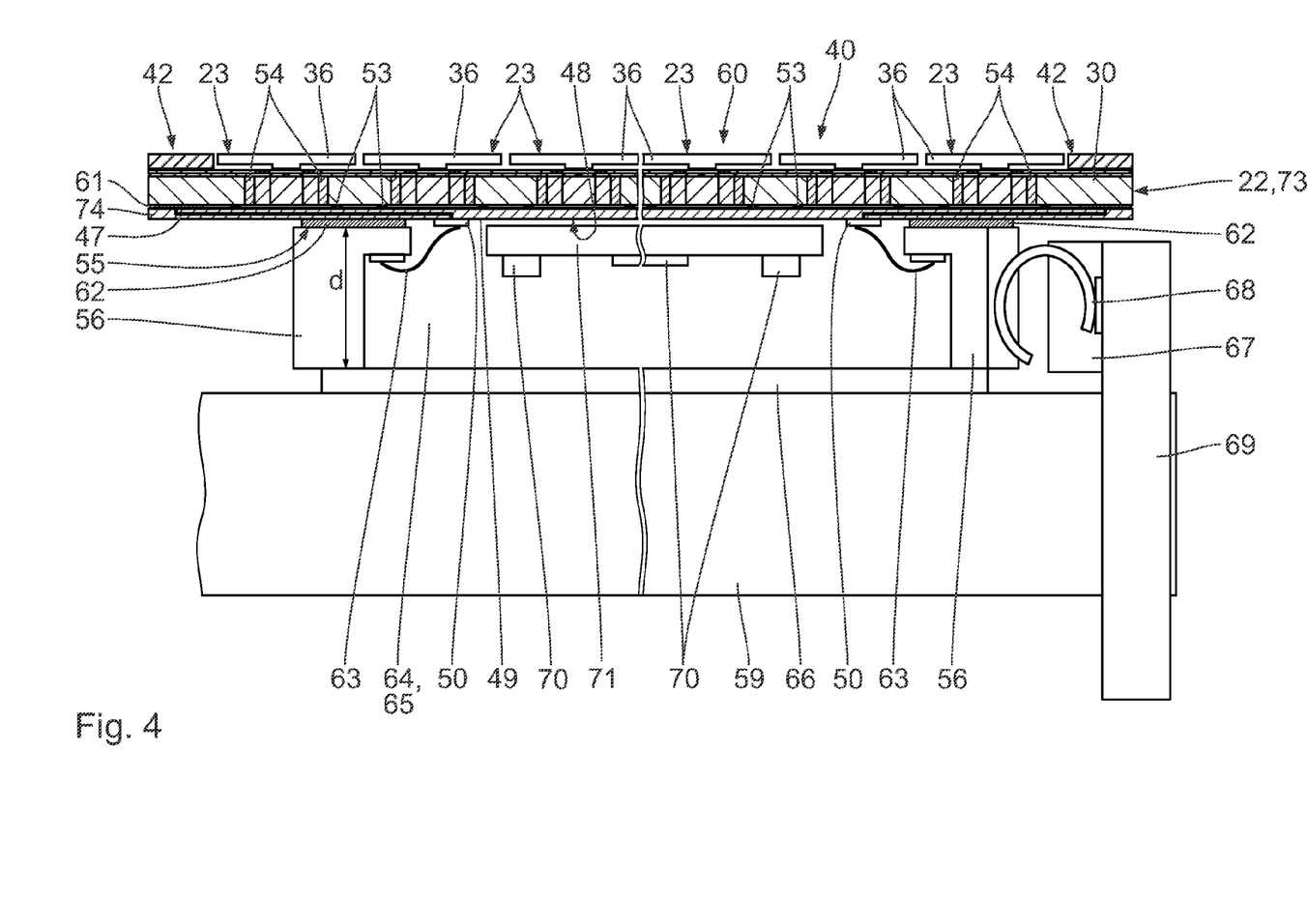
FIGS. 4 and 5 show illustrations in accordance with FIGS. 2 and 3 of an alternative embodiment of the optical component.
Figure 5:
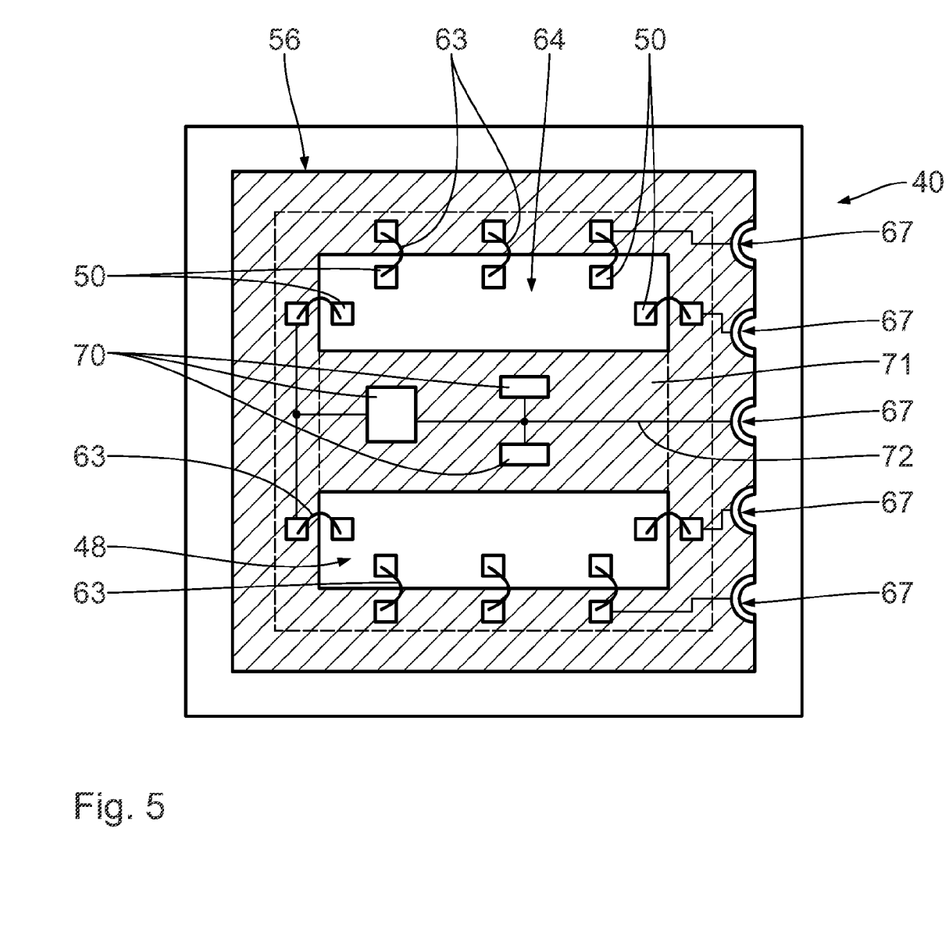

FIGS. 4 and 5 depict a further embodiment of the optical component 40 and the contacting thereof via the contact springs 68. The principal design of the optical component 40 depicted in FIGS. 4 and 5 corresponds to that of the exemplary embodiment depicted in FIGS. 2 and 3, the description of which is referred to herewith. In the exemplary embodiment depicted in FIGS. 4 and 5, the MOEMS 73 merely includes the mirror array 22. A carrying structure 43 can be dispensed with. This is also possible in the exemplary embodiment in accordance with FIGS. 2 and 3. The mirror array 22 can be sealed on the rear side 48 thereof, in particular via an intermediate layer 74 depicted non-schematically in the figures. The intermediate layer 74 forms a constituent of the mirror array 22.

In the exemplary embodiment depicted in FIGS. 4 and 5, electronic components 70, for example capacitors, sensors, ASICs, voltage controllers, active cooling elements, in particular Peltier elements, and/or further components are arranged in the cavity 64. The electronic components 70 in turn are arranged in a printed circuit board 71. The electronic components 70 are electrically conductively connected to one or more of the lateral contacts 67 by way of conductive tracks 72. The cooling elements (not depicted in the figures) are connected in a thermally conductive manner with the MOEMS and/or the electronic components and serve for the cooling thereof.

Arranging the electronic components 70 in the cavity 64 renders it possible to arrange the electronic components 70 closer to the MOEMS 73. This leads to improved electric properties, for example a lower supply resistance. Moreover, the complexity of the MOEMS 73 can be reduced by arranging electronic components 70 in the cavity 64.

Figure 6:
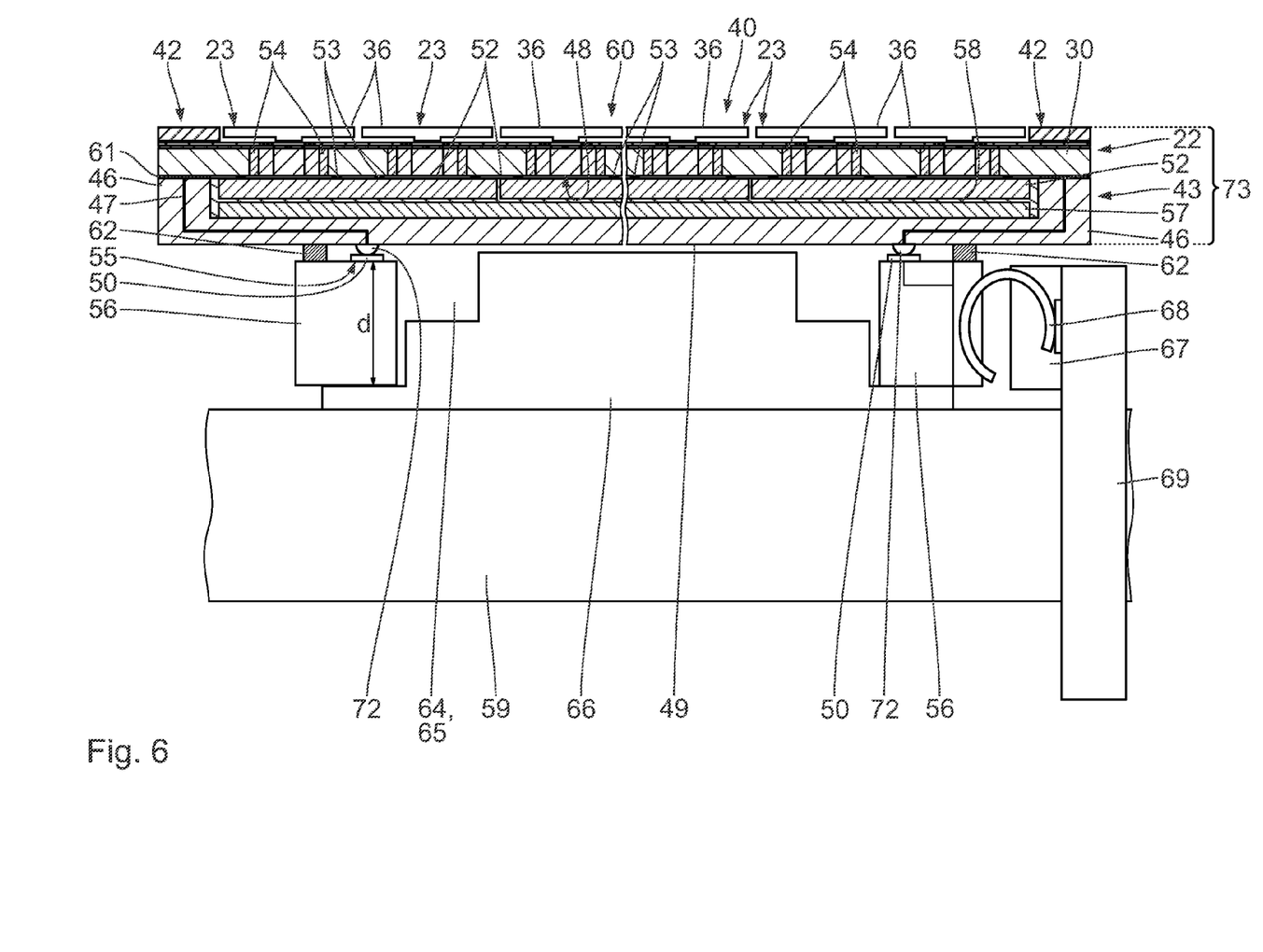
FIG. 6 shows an illustration in accordance with FIG. 2 of a further embodiment of an optical component.

As depicted schematically in FIG. 6, it is also possible to provide flip chip contacts 72 instead of wire-bond contacts for the electrically conductive connection between the printed circuit board 56 and the MOEMS 73, in particular the carrying structure 43 and/or the mirror array 22. Combinations with flip chip contact 72 and wire-bond contacts 63 are also possible.

In principle, the individual details of the exemplary embodiments depicted schematically in the figures and described above can be combined with one another as desired.

The component 40 forms a self-contained functional unit. In particular, it forms a constituent of an optical assembly 65, in particular of a facet mirror 13, 14 of the illumination optical unit 4 of the projection exposure apparatus 1. In principle, the assembly 65 could also be a constituent of the projection optical unit 7 of the projection exposure apparatus 1. The assembly 65 can have further constituents, for example a carrier, in particular in the form of the base plate 59. The base plate 59 forms a mechanically supporting element for the optical components 40. It has a size and shape which can be selected freely within the possibilities of material processing for the material of the base plate 59, in particular within the possibilities of metalworking. Moreover, the base plate 59 serves to cool the optical components 40. The components 40 are arranged on the base plate. In particular, they are affixed onto the base plate 59. As a result of the modular design of the component 40, it is possible, in principle, to arrange any number of components 40 on the base plate 59. The number and arrangement of components 40 is only restricted by the dimensions of the base plate 59. In general, the number of optical components 40 of the assembly 65 is at least 1, in particular at least 5, in particular at least 16, in particular at least 64, in particular at least 256. In particular, the components 40 are arranged on the base plate 59 in such a way that they parquet a predetermined region on the base plate 59 in a substantially gap-free manner. The components 40 are arranged on the base plate 59 in a particularly tight packed manner. Adjacent components 40 are arranged with a distance d from one another on the base plate 59. In particular, the distance d between adjacently arranged components 40 is at most 1 mm, in particular at most 500 µm, in particular at most 300 µm, in particular at most 200 µm, in particular at most 100 µm, in particular at most 50 µm. In particular, the distance d between two adjacently arranged components 40 is no greater than the lateral overhead of an individual component 40. As a result of the vertical integration of the individual components 40, it is therefore possible to produce an overall mirror area with substantially any shape, in particular any size, by arranging the components 40 on the base plate 59.

In accordance with an alternative embodiment, the components 40 are arranged, either individually or in groups, in an interchangeable, in particular non-destructively interchangeable manner on the base plate 59. As an alternative to this, it is possible to securely connect the components 40 with the base plate 59. By way of example, they can be connected to the base plate 59 via an adhesive layer (not depicted in the figures). As a result of this, it is possible, in particular, to even further improve the thermal conduction between the components 40 and the base plate 59.

What is claimed is:

1. An optical component, comprising:
 a micro-opto-electro-mechanical system (MOEMS) having a front side and a rear side;
 a printed circuit board supported by the rear side of the MOEMS; and
 a cover,
 wherein:
  the MOEMS, the printed circuit board and the cover delimit a cavity;
  the MOEMS delimits a first side of the cavity;
  the cover delimits a second side of the cavity in a vacuum-tight manner;
  the first side of the cavity is opposite the second side of the cavity; and
  the printed circuit board delimits a third side of the cavity which is between the first and second sides of the cavity.

2. The optical component of claim 1, wherein the printed circuit board comprises a multi-layer printed circuit board.

3. The optical component of claim 1, wherein the cavity is directly adjacent to the rear side of the MOEMS.

4. The optical component of claim 1, further comprising at least one member in the cavity, wherein the at least one member is selected from the group consisting of an electrical part and a cooling element.

5. The optical component of claim 1, further comprising a filler material in the cavity.

6. The optical component of claim 1, wherein the printed circuit board comprises lateral contacts.

7. The optical component of claim 6, wherein the lateral contacts comprise vertical interconnect accesses.

8. The optical component of claim 6, wherein the lateral contacts comprise self-centering lateral contacts.

9. The optical component of claim 6, wherein the printed circuit board comprises spring-loaded elements that electrically contact the lateral contacts.

10. The optical component of claim 1, further comprising contacts that electrically connect the printed circuit board and the MOEMS.

11. The optical component of claim 10, wherein the contacts comprise at least one member selected from the group consisting of wire-bond contacts, flip chip contacts and bond contacts.

12. A facet mirror, comprising:
 an optical component according to claim 1,
 wherein the facet mirror is a microlithography facet mirror.

13. The facet mirror of claim 12, wherein the facet mirror is a multi-mirror array.

14. An illumination optical unit, comprising:
 an optical component according to claim 1,
 wherein the illumination optical unit is a microlithography illumination optical unit.

15. An illumination system, comprising:
 a radiation source; and
 an illumination optical unit comprising an optical component according to claim 1,
 wherein the illumination system is a microlithography illumination system.

16. A projection exposure apparatus, comprising:
 an illumination optical unit an optical component according to claim 1, the illumination optical unit configured to illuminate an object field; and
 a projection optical unit configured to project the object field into an image field,
 wherein the projection exposure apparatus is a microlithography projection exposure apparatus.

17. A method of operating a microlithography projection exposure apparatus comprising an illumination optical unit and a projection optical unit, the illumination optical unit comprising an optical component, the method comprising:
 using the illumination optical unit to illuminate an object field; and
 using the projection optical unit to project the object field into an image field,
 wherein the optical component comprises an optical component according to claim 1.

18. The optical component of claim 1, wherein the MOEMS projects laterally beyond the printed circuit board.

19. The optical component of claim 1, wherein a cross-section of the printed circuit board is less than an overall reflection area of the optical component.

20. An optical component, comprising:
- a micro-opto-electro-mechanical system (MOEMS) having a front side and a rear side;
- a printed circuit board supported by the rear side of the MOEMS; and
- a cover, wherein:
- the printed circuit board, the MOEMS and the cover delimit a vacuum-tight cavity;
- the MOEMS delimits a first side of the cavity;
- the cover delimits a second side of the cavity which is opposite the first side of the cavity;
- the printed circuit board delimits a third side of the cavity which is between the first and second sides of the cavity.

* * * * *

UNITED STATES PATENT AND TRADEMARK OFFICE
CERTIFICATE OF CORRECTION

Page 1 of 1

| | |
|---|---|
| PATENT NO. | : 9,851,555 B2 |
| APPLICATION NO. | : 15/050664 |
| DATED | : December 26, 2017 |
| INVENTOR(S) | : Markus Holz et al. |

It is certified that error appears in the above-identified patent and that said Letters Patent is hereby corrected as shown below:

In the Specification

Column 1, Line 13: After "herein" insert -- . --.

Column 1, Lines 40-47: Delete "a front side and a rear side; at least one printed circuit board; and a cavity sealed in a vacuum-tight manner. The at least one printed circuit board is arranged on the rear side of the at least one MOEMS. The core of the disclosure consists of providing an optical component with at least one MOEMS on the rear side of the MOEMS with a printed circuit board. The optical component includes a cavity sealed to the outside in a vacuum-tight manner." and insert the same on Column 1, Line 39, as a continuation of same paragraph.

Column 5, Lines 59-62: Delete "projection exposure apparatus 1. Depending on the imaging scale of the projection optical unit 7, it is also possible for the reticle to be scanned in the opposite direction relative to the wafer." and insert the same on Column 5, Line 58, as a continuation of same paragraph.

Signed and Sealed this
Twenty-seventh Day of March, 2018

Andrei Iancu
*Director of the United States Patent and Trademark Office*